US009396301B1

(12) United States Patent
Lee et al.

(10) Patent No.: US 9,396,301 B1
(45) Date of Patent: Jul. 19, 2016

(54) METHOD, SYSTEM, AND COMPUTER PROGRAM PRODUCT FOR INTERCONNECTING CIRCUIT COMPONENTS WITH TRACK PATTERNS FOR ELECTRONIC CIRCUIT DESIGNS

(71) Applicant: Cadence Design Systems, Inc., San Jose, CA (US)

(72) Inventors: Yinnie Lee, Campbell, CA (US); Jeffrey Markham, San Jose, CA (US); Roland Ruehl, San Carlos, CA (US); Karun Sharma, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/292,166

(22) Filed: May 30, 2014

(51) Int. Cl.
*G06F 17/50* (2006.01)

(52) U.S. Cl.
CPC ........ *G06F 17/5077* (2013.01); *G06F 17/5081* (2013.01)

(58) Field of Classification Search
CPC .............. G06F 17/5077; G06F 17/509; G06F 2217/78; G06F 2217/80
USPC .................. 716/112, 126, 129, 130
See application file for complete search history.

(56) References Cited

U.S. PATENT DOCUMENTS

| 8,316,326 | B1 | 11/2012 | Pierrat |
| 8,707,223 | B2 | 4/2014 | Blatchford |
| 8,782,570 | B1 | 7/2014 | Li |
| 8,871,104 | B2 | 10/2014 | Park |
| 9,141,751 | B2 | 9/2015 | Lee |
| 9,158,885 | B1 | 10/2015 | Gray |
| 2008/0028352 | A1* | 1/2008 | Birch et al. ............... 716/12 |
| 2015/0234974 | A1 | 8/2015 | Dechene |

OTHER PUBLICATIONS

Notice of Allowance dated Feb. 8, 2015 for U.S. Appl. No. 14/292,122.

* cited by examiner

*Primary Examiner* — Vuthe Siek
(74) *Attorney, Agent, or Firm* — Vista IP Law Group, LLP

(57) ABSTRACT

Methods and systems for interconnecting circuit components with track patterns are disclosed. The method identifies a source pin on a first track and a destination pin on a second track and determines a third track in a different routing direction based on design rules governing track patterns. The method further determines a transition pattern for the interconnection between the source pin and the destination pin by using at least the third track. The method may use one or more dummy pins or ordering of pin connections in implementing the interconnection to satisfy certain design rules. The lengths of some wire segments of the interconnection may be further adjusted to satisfy certain design rules. Compaction may be performed to have two wire segments share the same track while the lengths or widths of one or both wire segments may be further modified to ensure design rule compliance.

20 Claims, 17 Drawing Sheets

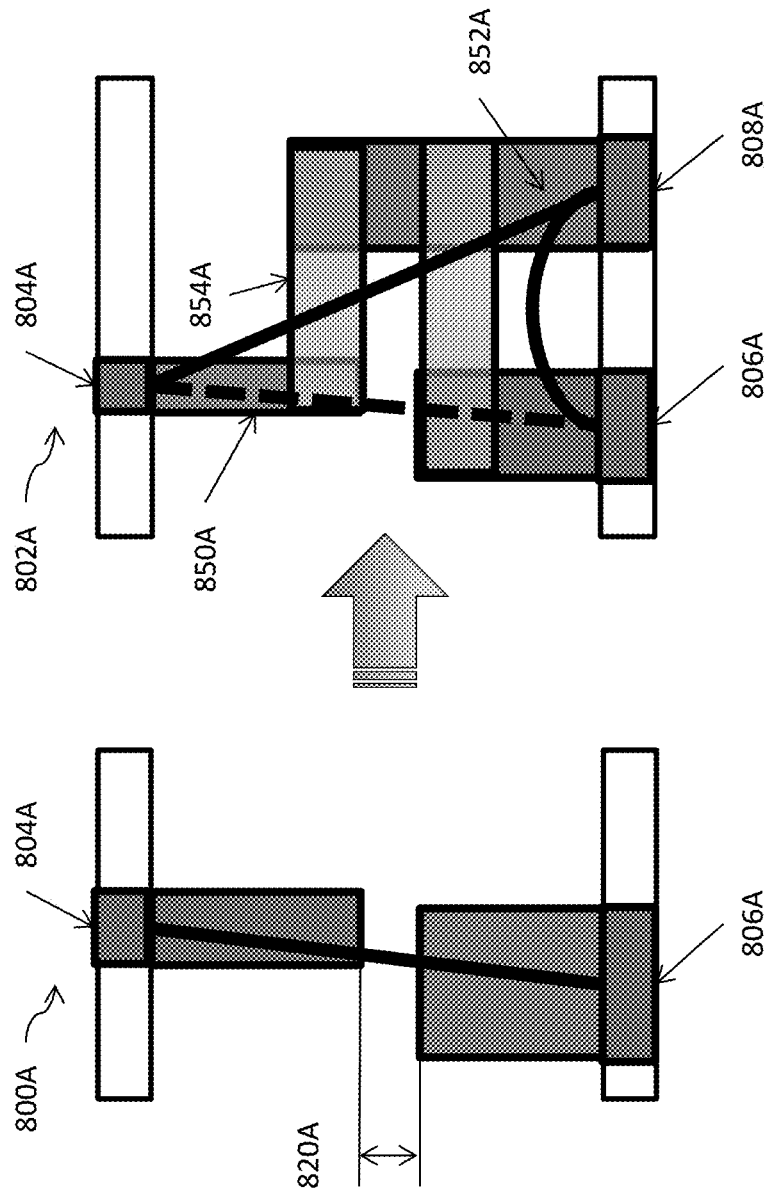

METHOD, SYSTEM, AND COMPUTER PROGRAM PRODUCT FOR INTERCONNECTING CIRCUIT COMPONENTS WITH TRACK PATTERNS FOR ELECTRONIC CIRCUIT DESIGNS

CROSS REFERENCE TO RELATED APPLICATION(S)

This application is related to U.S. patent application Ser. No. 14/231,688 entitled "METHOD, SYSTEM, AND COMPUTER PROGRAM PRODUCT FOR IMPLEMENTING TRACK PATTERN SYNTHESIS FOR ELECTRONIC CIRCUIT DESIGNS" and filed on Mar. 31, 2014, U.S. patent application Ser. No. 14/292,067 entitled "METHOD, SYSTEM, AND COMPUTER PROGRAM PRODUCT FOR IMPLEMENTING TRACK PATTERNS FOR ELECTRONIC CIRCUIT DESIGNS", and U.S. patent application Ser. No. 14/292,122 entitled "METHOD, SYSTEM, AND COMPUTER PROGRAM PRODUCT FOR IMPLEMENTING REPETITIVE TRACK PATTERNS FOR ELECTRONIC CIRCUIT DESIGNS". The content of the aforementioned U.S. patent applications is hereby expressly incorporated by reference in its entirety for all purposes.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

In an effort to deal with and simplify otherwise extremely complex design rules at advanced process rules, foundries are now turning to a different approach in which routing regions of a design on any particular metal layer are performed only on a set of specific metal tracks, each of which may only take on width values from a discrete set of legal widths that may be made available in the process Design Rule Manual (DRM). Furthermore, in order to facilitate self-aligned double patterning (SADP) processes and deal with mask designation issues, additional constraints may be created by which track widths may be selected. For example, after a first track is chosen and assigned a mask color (e.g. B for Blue), the next track may need to be assigned a different color (e.g., C for Cyan), and may only take one of a discrete set of legal width values, where that set in turn is a function of the preceding B track width.

An electronic design may correspond to and thus include more than ten different size wires, and the tracks for the electronic design may thus be associated with as many legal widths. Any attempt to manually figure out which track associated with a given width may be immediately neighboring another track associated with a given width is nearly impossible due to the sheer number of different possible legal combinations of tracks, especially in light of the extremely complex design rules that govern what track patterns are legal. Therefore, generating a legal track pattern including a plurality of tracks associated with some legal widths is nearly impossible to be performed manually, especially when an electronic design includes more than a few legal or permissible widths. Repetitive track patterns present further issues in that each track pattern needs to comply with the governing design rules and constraints for track patterns, and the repetitive track patterns as a whole also needs to comply with the same set of governing design rules and constraints. Any additions or removal of one or more tracks to a track pattern may propagate throughout the repetitive track patterns, even if a single track pattern may comply with all the pertinent design rules and constraints. Interconnecting two circuit components (e.g., two blocks) exhibits additional complexity due to the presence and thus requirements of one or more track patterns in the designs of the two circuit components. For example, interconnecting a set of source pins to another set of destination pins is no longer as simple as the already complex problem of arranging wire segments to satisfy conventional design rules. Rather, in addition to the conventional design rules, the interconnections must satisfy the set of design rules governing legal combinations of widths.

Therefore, there exists a need for effective ad efficient techniques to interconnect circuit components with track patterns for electronic circuit designs.

SUMMARY

Disclosed are method(s), system(s), and article(s) of manufacture for interconnecting circuit components with track patterns for electronic circuit designs in one or more embodiments. Some embodiments are directed at a method for interconnecting circuit components with track patterns for electronic circuit designs. These methods may use a computer to execute a sequence of instructions to identify an electronic design that includes one or more source pins, terminals, pads, or any combinations thereof (hereinafter "pin" or "pins" collectively) on one or more corresponding first tracks and one or more destination or target pins (collectively "destination pin" or "destination pins" hereinafter) on one or more corresponding second tracks. The methods may further identify or determining a transition pattern for interconnecting the source pin and the destination pin.

A transition pattern may include a schematic pattern including one or more connected line segments that connect the source pin to the destination pin. The methods may identify or determine the transition pattern by using multiple tracks that are identified or determined based at least in part upon a collection of legal combination of widths associated with tracks or a set of legal track patterns. The method may then interconnect the source pin and the destination pin based at least in part upon the transition pattern. In some embodiments, the methods may further identify or determine an ordering of interconnection or one or more dependency relations in the act of identifying the electronic design. In addition or in the alternative, the methods may identify the respective widths or other characteristics associated with at least the first track and the second track in identifying the electronic design.

In some embodiments, the methods may further identify a third track in a second routing direction and a dummy track for either or both of the first track and the second track in a first routing direction in the act of identifying or determining the transition pattern. The dummy track may be inserted into a track pattern in the electronic design after it is determined that the dummy track satisfies one or more pertinent design rules governing tracks or track patterns. A dummy pin may be created along the dummy track and used in interconnecting the source pin to the destination pin. In some embodiments, the methods may compact the electronic design by moving at least one shape located along a first track to a second track. The width of the track may be modified to comply with the width associated with the second track. The length of the at least one shape or one or more other shapes along the second track may also be modified to satisfy one or more pertinent design rules.

Some embodiments are directed at a hardware module or system that may be invoked to perform any of the methods, processes, or sub-processes disclosed herein. The hardware system may include a track pattern processing module, a track pattern database enumeration and maintenance module, an implementing option processing module, a track pattern generation module, and/or a track pattern evaluation module in some embodiments. The hardware system may further include one or more forms of non-transitory machine-readable storage media or devices to temporarily or persistently store various types of data or information such as the firmware. Some illustrative modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some illustrative forms of the non-transitory machine-readable storage media may also be found in the System Architecture Overview section below.

More details of various aspects of the methods, systems, or articles of manufacture for implementing track patterns for electronic circuit designs are described below with reference to FIGS. 1-11.

BRIEF DESCRIPTION OF THE DRAWINGS

The drawings illustrate the design and utility of various embodiments of the invention. It should be noted that the figures are not drawn to scale and that elements of similar structures or functions are represented by reference numerals throughout the figures. In order to better appreciate how to obtain the above-recited and other advantages and objects of various embodiments of the invention, a more detailed description of various embodiments briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIGS. 8A-C illustrate an illustrative order of interconnections in some embodiments.

DETAILED DESCRIPTION

Various embodiments of the invention are directed to a methods, systems, and articles of manufacture for interconnecting circuit components with track patterns for electronic circuit designs. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of various embodiments described herein. Where certain elements of some embodiments may be partially or fully implemented using known components (or methods or processes), only those portions of such known components (or methods or processes) that are necessary for an understanding of various described embodiments will be described, and the detailed descriptions of other portions of such known components (or methods or processes) will be omitted so as not to obscure the invention. Further, various embodiments encompass present and future known equivalents to the components referred to herein by way of illustration.

Figure 1:
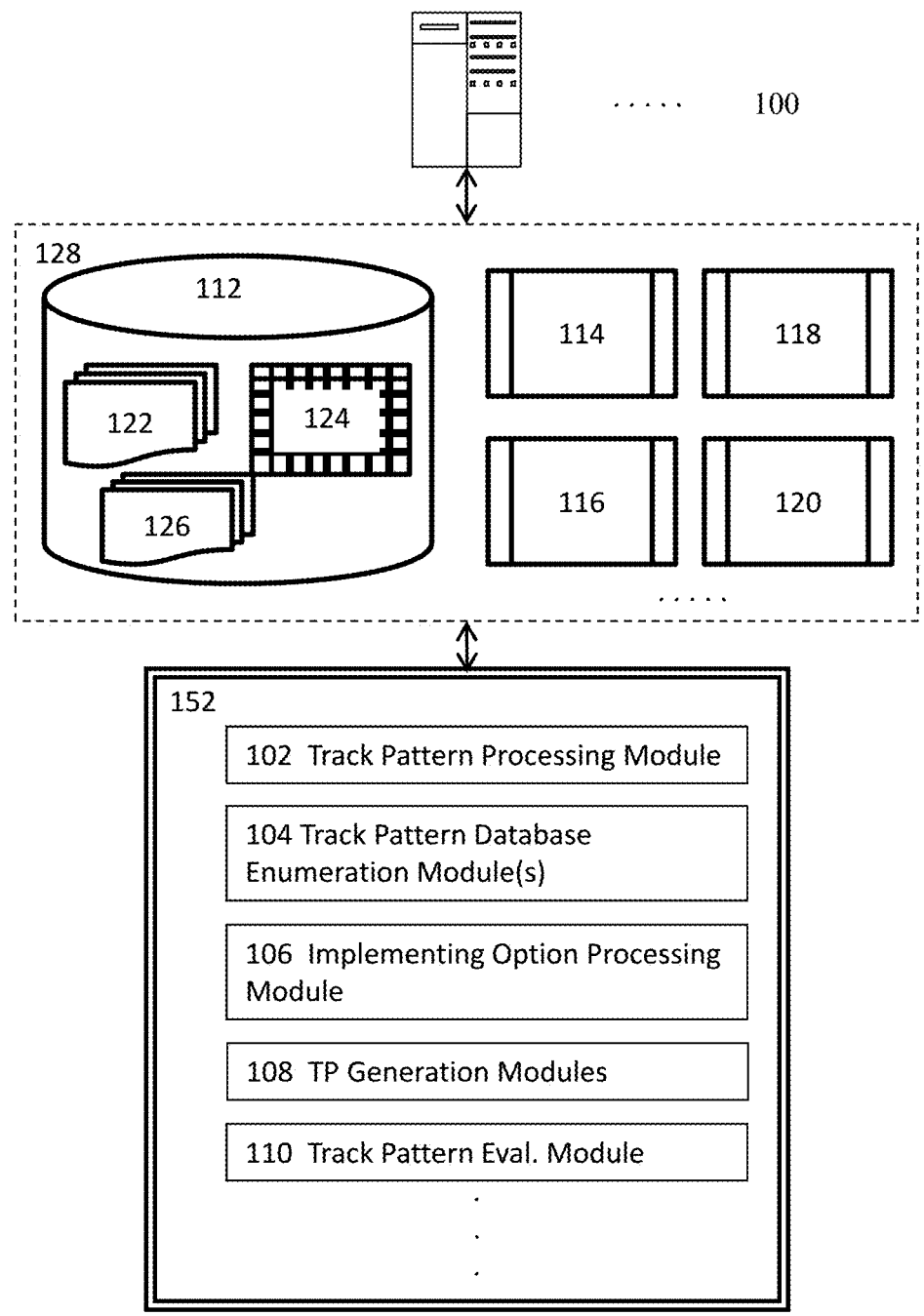
FIG. 1 illustrate a illustrative high level schematic block diagrams for a system for interconnecting circuit components with track patterns for electronic circuit designs in some embodiments.

Disclosed are method(s), system(s), and article(s) of manufacture for interconnecting circuit components with track patterns for electronic circuit designs in one or more embodiments. FIG. 1 illustrates a illustrative high level schematic block diagrams for interconnecting circuit components with track patterns for electronic circuit designs. In one or more embodiments, FIG. 1 illustrates an illustrative high level schematic block diagrams for interconnecting circuit components with track patterns for electronic circuit designs and may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access various resources 128 that may comprise a floorplanner, a global routing engine, and/or a detail routing engine 114, a layout editor 116, a design rule checker 118, a verification engine 120, etc. The one or more computing systems 100 may further write to and read from a local or remote volatile or non-volatile computer accessible storage 112 that stores thereupon data or information such as, but not limited to, one or more databases (124) such as schematic design database(s) or physical design database(s), electronic circuit design specification database(s), various statistics, various data, rule decks, various design rules, constraints, etc. (122), or other information or data (126) that may be used to facilitate the performance of various functions to achieve the intended purposes.

In some embodiments, the one or more computing systems 100 may, either directly or indirectly through various resources 128 to invoke various software, hardware modules or combinations thereof 152 that may comprises one or more track pattern processing modules 102 to insert, remove, modify, improve, optimize, or otherwise operate upon tracks or routing tracks in track patterns, one or more track pattern database enumeration and maintenance modules 104 to enumerate, determine, or update legal track pattern database(s) to generate viable implementing options for track associated with various widths, one or more implementing option processing modules 106 to identify, determine, modify, or rank viable implementing options for various tracks and/or track patterns, one or more track pattern generation and prediction modules 108 to generate, update, modify, or otherwise perform various operations on track patterns and/or to forward predict subsequent additions of tracks into a track pattern, and one or more track pattern evaluation modules 110 to evaluate track patterns against various design rules, performance objectives, manufacturing requirements, or other constraints.

A routing track or simply a track (hereinafter a "track") includes a one-dimensional fictitious line or line segment derived from the manufacturing grids provided by foundries. A routing track thus having zero width in physical designs (e.g., a layout of an electronic design) and is used to guide physical implementation tools (e.g., floorplanner, placement tools, or routing tools) to implement the physical design for an electronic design. For example, a routing tool may lay the centerline of a wire segment along a routing track during the routing process. A routing track may nonetheless be associated with a width to indicate that the particular routing track is to be used to route wires having the associated width. In this application, some routing tracks may be illustrated as rectangular shapes to indicate that such routing tracks are associated with the widths as shown in various figures. Nonetheless, the rectangular representations of such routing tracks are not intended to explicitly, implicitly, or inherently indicate that routing tracks have two-dimensional geometrical structures or shapes. A track pattern includes a collection of one or more tracks running in parallel and arranged in a certain sequence or order.

Figure 2:
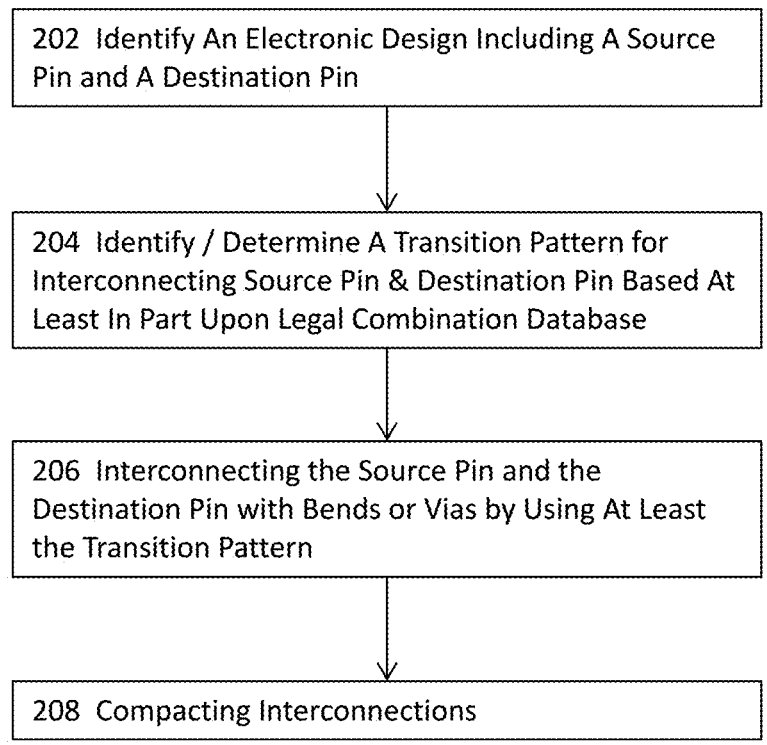
FIG. 2 illustrates a high level flow diagram for a method or system for interconnecting circuit components with track patterns for electronic circuit designs some embodiments.

FIG. 2 illustrates a high level flow diagram for a method or system for interconnecting circuit components with track patterns for electronic circuit designs some embodiments. In these embodiments illustrated in FIG. 2, the method or system may first identify an electronic design that includes a source pin on a first track in a first cell, block, or area (collectively block hereinafter) of the electronic design and a destination pin on a second track in a second block of the electronic design at 202.

The method or system may then identify or determine a transition pattern for interconnecting the source pin and the destination pin at 204 based at least in part upon the data or information included in a track or pattern database that includes information about a plurality of legal track patterns or a plurality of legal combinations of widths associated with corresponding tracks in track patterns. A transition pattern may include a schematic pattern (the schematic patterns 1002B, 1004B, 1006B, 1008B, or 1010B in FIG. 10B) or an actual interconnect pattern including one or more interconnect or wire segments that connect a source pin to a destination pin in some embodiments. In some embodiments, a transition pattern includes only the interconnect segments in the wrong-way direction but not the interconnect segments in the right-way direction in which a source pin or a destination pin lies.

At 206, the method or system may interconnect the source pin and the destination pin with one or more bends or vias by using at least the transition pattern. For example, if wrong-way routing is permitted for the electronic design, the method or system may implement the interconnections with one or vias, if needed. On the other hand, wrong-way routing may be prohibited in some electronic designs or certain layers thereof. In this latter case, the method or system may implement the interconnections between the source and destination pins with one or more vias. At 208, the method or system may optionally compact at least some wire segments for the electronic design.

Figure 3:
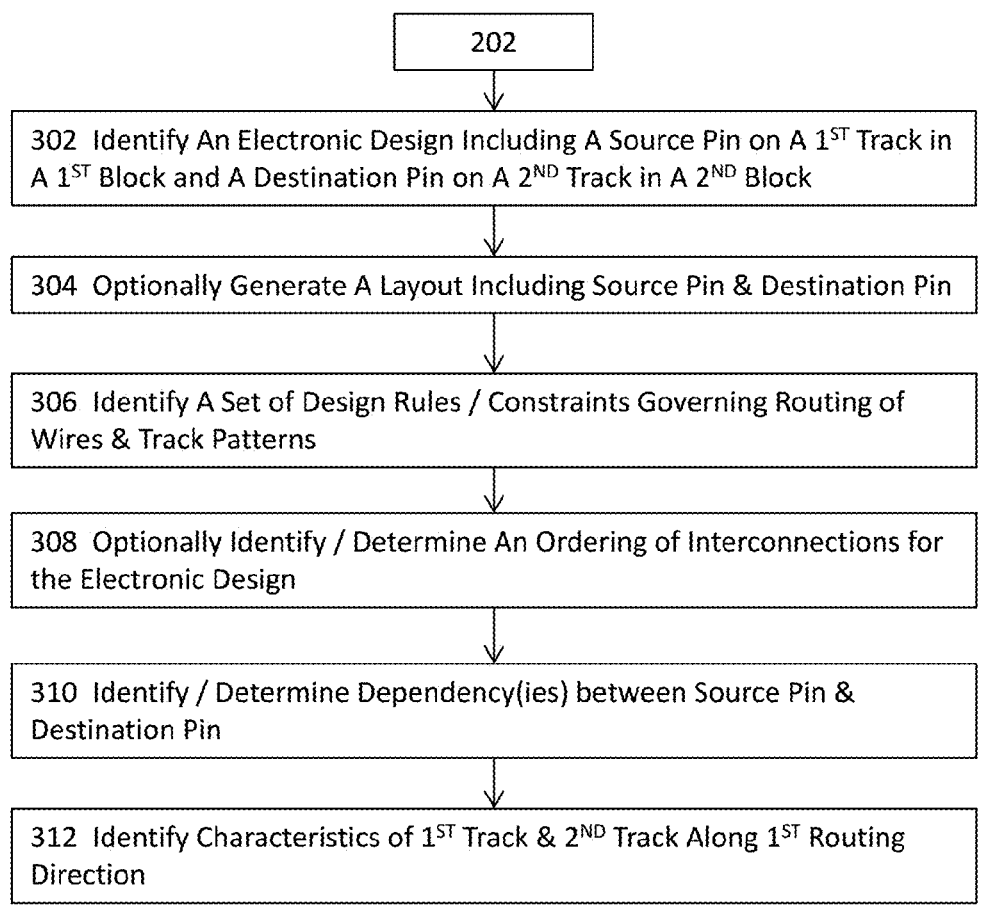
FIG. 3 illustrates a more detailed flow diagram for a process or module for implementing repetitive track patterns for electronic circuit designs illustrated in FIG. 2 in some embodiments.

FIG. 3 illustrates a more detailed flow diagram for a process or module for implementing repetitive track patterns for electronic circuit designs illustrated in FIG. 2 in some embodiments. More specifically, FIG. 3 illustrates more details about the process or module 202 for identifying an electronic design of FIG. 2. The process or module 202 may identify a source pin and a destination pin for which interconnection is desired at 302. In some embodiments, the source pin belongs to a first block and lies along a first track, and the destination pin belongs to a second block and lines along a second track. The process or module 202 may further optionally generate a layout including the source pin and the destination pin at 304.

Some illustrative layouts including source pins and destination pins of two separate blocks are shown in FIGS. 9A and 10A-C. A set of design rules, requirements, or constraints (hereinafter design rules or rules collectively) that govern tracks, track patterns, or interconnections between pins or implementation of electronic designs may be identified at 306. Illustrative design rules may include, for example, a minimum spacing design rule governing the minimum spacing between two adjacent wires, design rules governing which tracks associate with associated with certain widths may be situated immediately adjacent to another track associated with a width (e.g., pair rules or BC rules where B stands for blue and C stands for cyan in double patterning governing which two-width combinations are legal or triplet rule or BCB rule governing which three-width combinations are legal, etc.), one or more other design rules such as a minimum length rule governing the minimum length required for an interconnect segment, a same track line-end design rule, a different track line-end design rule, a keep-out design rule, or one or more design rules governing repetitive track patterns, etc.

In addition or in the alternative, the process or module 202 may further optionally identify or determine an ordering of interconnections that provides some guidelines for interconnecting pins in conjunction with the set of design rules for the electronic design at 308. For example, the ordering of interconnections may prohibit direct connection from a source pin to a destination in some embodiments. Rather, the ordering of interconnections may require the use of one or more dummy pins to facilitate the interconnection between a source pin and a destination pin. FIG. 8A illustrates the prohibition of direct connection and the use of a dummy pin for the interconnection. FIG. 8A also illustrates the situation where the projected width of the source pin and that of the destination pin overlap with each other, and a dummy pin is thus needed to resolve the connection dependency.

In FIG. 8A, the interconnection as shown in 800A between the source pin 804A and the destination pin 806A is prohibited. Rather, the ordering of interconnections allows the interconnection as shown in 802A where a dummy pin 808A is used. Therefore, the interconnection between the source pin 804A and the destination 806A is first established between the source pin 804A and the dummy pin 808A, which is in turn connected to the original destination pin 806A. The ordering of interconnections may introduce downward dependency between the source pin and the destination pin when the projected width of the source pin overlaps the projected width of the destination pin. It shall be noted that the term "downward" is used above to indicate the ordering of processing from the upper portion to the lower portion of an electronic design due to the vertical orientation of various illustrative layouts in this application.

Figure 8B:
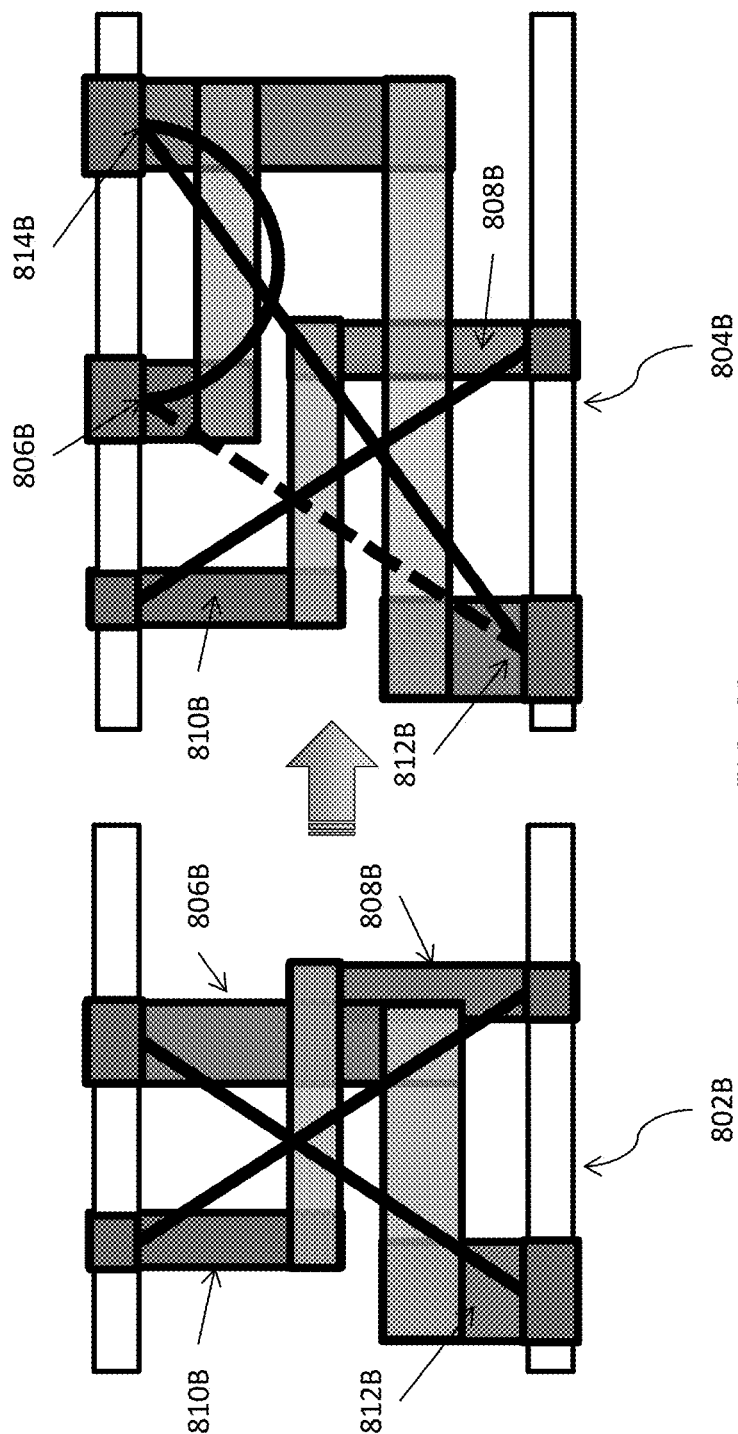

Nonetheless, it is understood that an electronic design may also be first processed from the bottom portion or in a left-to-right or right-to-left fashion. Therefore, the term "downward" is not intended to limit the scope of the application to only the illustrative embodiments show. In some embodiments, the ordering of interconnection may further introduce at least a minimum distance between the end points of the source pin and the destination pin (e.g., 820A). For example, FIG. 8B illustrates the source pin 806B and the destination pin 808B overlap with each other. FIG. 8A also illustrates that the projected width of the source pin 804A overlaps the projected width of the destination pin 806A. In these cases, line-end dependency may cause loops with one or more edges or one or more vertices or connections.

The ordering of interconnection may thus use one or more dummy pins (e.g., 814B in FIG. 8B or 808A in FIG. 8A) to facilitate the interconnection. In FIG. 8B, the interconnection between the source pin 806B and the destination pin 812B may be first established from the source pin 806B to the dummy pin 814B, which is in turn connected to the destination pin 812B as shown in 804B as opposed to the prohibited interconnection as shown in 802B. The interconnection between the source pin 810B and the destination pin 808B remains unchanged due to the use of the dummy pin 808B and thus compliance with the pertinent design rules.

Figure 8C:
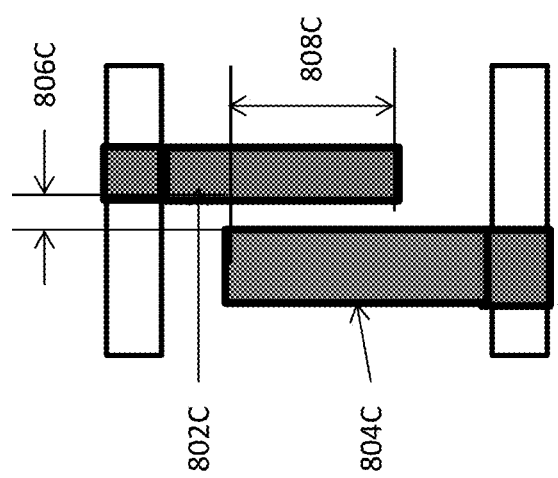

In some embodiments, the projected width of the source pin and the projected width of the destination pin do not overlap but are sufficiently close to trigger for example the pair design rule, the triplet design rule, the keep-out design rule, etc. In these embodiments, the ordering of interconnections may also use one or more dummy pins to facilitate the interconnection between pins. For example, FIG. 8C illustrates that two pins 802C and 804C are sufficiently close to each other. Assuming the close proximity 806C of these two pins triggers the application of the pair and/or the triplet design rules because these two pins are sufficiently close to be treated as wire segments subject to the aforementioned design rules, the ordering of interconnections may use one or more dummy pins to facilitate the interconnection.

In the example shown in FIG. 2C, the process or module 202 may use two dummy pins—one for the source pin and the other for the destination pin due to the close proximity of these two pins. In addition, these two pins are also sufficiently close to trigger the keep-out rule which governs the distance 808C within a range of values and subject to an upper bound and a lower bound. The close proximity indicated by the distance 806C may also subject the distance 806C to the governing spacing design rule. At 310, the process or module 202 may identify or determine one or more dependencies between the source pin(s) and the destination pin(s). In some of those embodiments illustrated in FIG. 8A where the projected widths of the source and the destination pins overlap, the process or module 202 may identify a downward dependency.

In some of those embodiments illustrated in FIG. 8C where the non-overlapping source pin and the destination pin are sufficiently close to trigger the pair design rule and/or the triplet design rule, the process or module 202 may identify an upward dependency such that the implementation result satisfies the pair design rule, the triplet design rule, the keep-out design rule, and the line-end spacing design rule governing the spacing between the end points of two wire segments on different tracks, etc. At 312, the process or module 202 may identify one or more characteristics of the first track and the second track along the first routing direction of the routing layer. In some embodiments, the first routing direction may include the preferred or permitted routing direction. In some of these illustrated embodiments, the one or more characteristics may include, for example, the widths associated with the first track and the second track, the track pattern(s) to which the first track or the second track belongs, etc.

Figure 4:
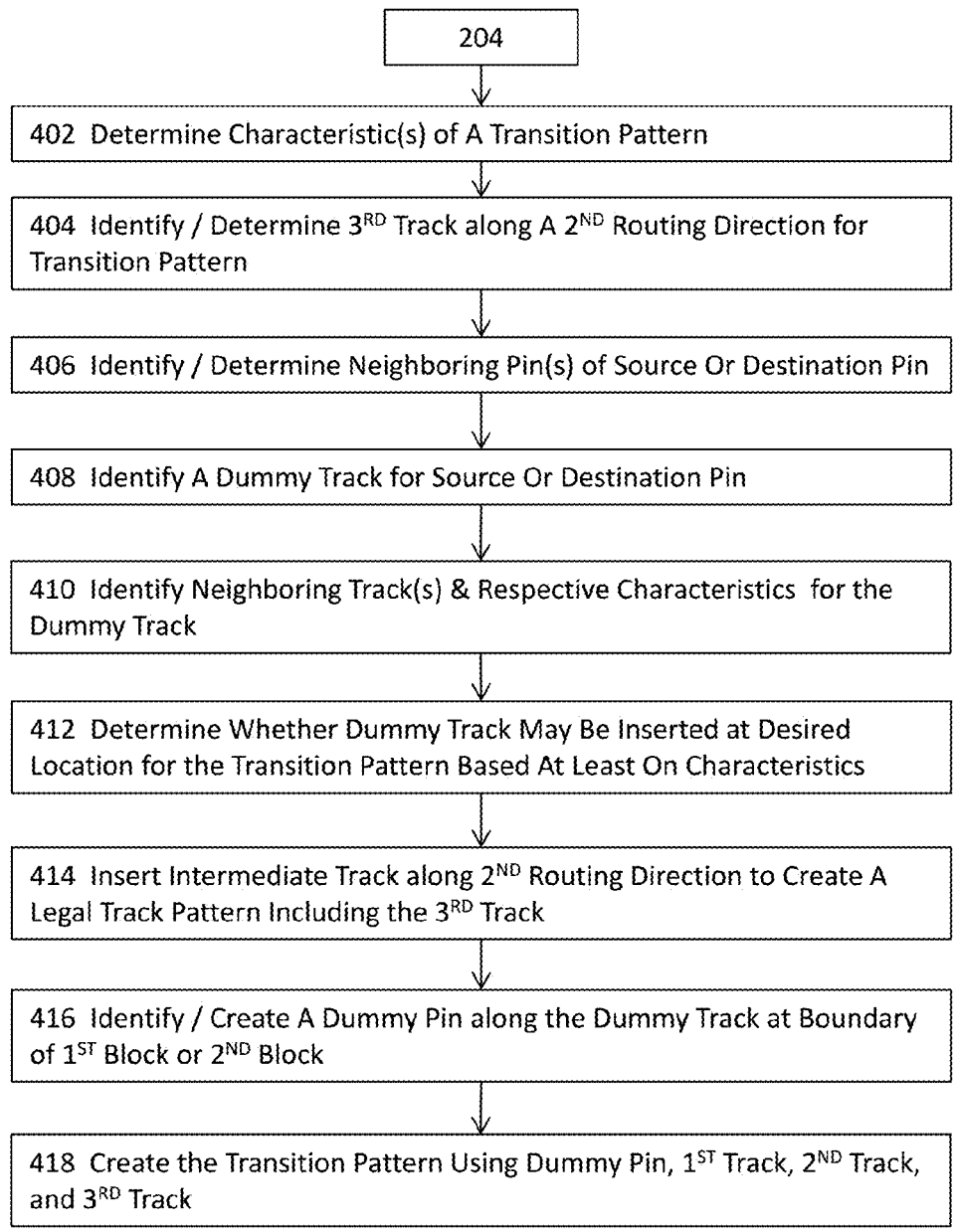
FIG. 4 illustrates a more detailed flow diagram for a process or module for implementing repetitive track patterns for electronic circuit designs illustrated in FIG. 2 in some embodiments.

FIG. 4 illustrates a more detailed flow diagram for a process or module for implementing repetitive track patterns for electronic circuit designs illustrated in FIG. 2 in some embodiments. More specifically, FIG. 4 illustrates more details about the process or module 204 for identifying or determining a transition pattern of FIG. 2. The process or module 204 may determine one or more characteristics of the transition pattern at 402. The one or more characteristics of a transition pattern may include, for example, one or more widths for the one or more interconnect segments in the transition pattern. For example, in those embodiments illustrated in FIG. 8A, the width of the interconnect segment 850A may be determined to be the width associated with the track on which the pin 804A (and also the interconnect segment 850A) lies.

Similarly, the width of the interconnect segment 852A may be determined to be the width associated with the track on which the pin 808A lies. In some embodiments, the width to be associated with the track on which the interconnect segment 854A lies may be determined to be the larger of the widths associated with the respective tracks on which pins 804A and 808A lie. In some other embodiments, the width of the interconnect segment 854A in the transition pattern may be determined by selecting a track that is associated with a width to satisfy one or more electrical requirement (e.g., the current density requirement, electro-migration requirement, etc.) or performance requirements or objectives (e.g., timing requirements, signal integrity, etc.)

At 404, the process or module may identify or determine a third track in a second routing direction for the transition pattern. It shall be noted that the term "second routing direction" is used here to distinguish from the first routing direction in which the tracks for the source pin and the destination pin lie. The "second routing direction" does not imply that the routing layer on which the source pin and the destination pin reside allows for two routing directions. In other words, the third track identified may reside on the same routing layer with the source and the destination pins when wrong-way routing is permitted on this routing layer in some embodiments or on an immediately adjacent routing layer when wrong-way routing is prohibited in some other embodiments. The third track is to be identified or determined in such a way to satisfy various design rules including those described for reference numeral 202 of FIG. 2.

At 406, one or more neighboring pins may be identified for the source pin, the destination pin, or both the source pin and the destination pin. A neighboring pin includes a pin that may be available for implementing the interconnection between the source pin and the destination pin. A neighboring pin may be identified from an available track that is as close to the source pin or the destination pin as possible when one of the objectives is to reduce or minimize the length of certain nets (e.g., signal nets) in some embodiments. In some embodiments, a neighboring pin may be identified from a dummy track in a track pattern. More details about dummy tracks are described in the related U.S. patent applications in the Cross Reference to Related Applications section of this Application.

At 408, the process or module 204 may identify a dummy track for the source pin, the destination pin, or both the source pin and the destination pin. In some of these embodiments illustrated in FIG. 4, the process or module 204 may identify which pin a dummy pin is identified for based at least in part upon the dependencies described above. In some embodiments, the process or module 204 may identify one or more dummy pins for both the source pin and the destination pin. At 410, the process or module may identify one or more neighboring tracks for the dummy track. In some of these embodiments, one or more characteristics may also be identified for these one or more neighboring tracks. These one or more characteristics may include, for example, the respective widths or the respective photomask designations associated with these one or more neighboring tracks, etc.

The one or more neighboring tracks identified at 410 may reside on one side or both sides of the dummy track. At 412, the process or module 204 may determine whether the dummy track associated with a desired width for implementing the transition pattern may be situated at a desired location based at least in part upon the transition pattern and the one or more characteristics of the one or more neighboring tracks. In these embodiments, the process or module may examine various design rules including, for example, the pair design rule, the triplet design rule, the photomask designation design rule, etc. to determine whether the track pattern including the dummy track at the desired location satisfies various design rules so that the resulting track pattern results in a legal track pattern.

In some embodiments, the process or module may consult the database, matrices, or tables including legal combinations of widths associated with corresponding tracks or legal track patterns to make the determination at 412. If a track pattern including one or more dummy tracks in the layout portion of interest has already been determined before 408, the method or system may identify a dummy track from the one or more dummy tracks at 408. On the other hand, if there is no dummy track or track patterns in the layout portion of interest, the process or module 204 may identify a candidate location for the dummy track and determine whether a dummy track may be inserted at the candidate location at 412 based at least in part upon one or more neighboring tracks and their respective characteristics identified at 410.

The process or module 204 may optionally arrange or insert one or more intermediate tracks to bride an existing track (e.g., the one or more neighboring tracks) with the dummy track to satisfy various design rules. For example, if the dummy track for interconnecting the source pin and the destination pin is to be associated with a large width, but the immediately neighboring track is associated with a small width such that the combination of these two widths fails to constitute a legal combination, the process or module 204 may insert one or more intermediate tracks therebetween at 414 to render the resulting track pattern or combination legal. At 416, the process or module 204 may identify or create a dummy pin along the dummy track at the boundary of the first block or the second block. At 418, the process or module 204 may create the transition pattern by using one or more dummy pins, the third track, and the third track.

Figure 5:
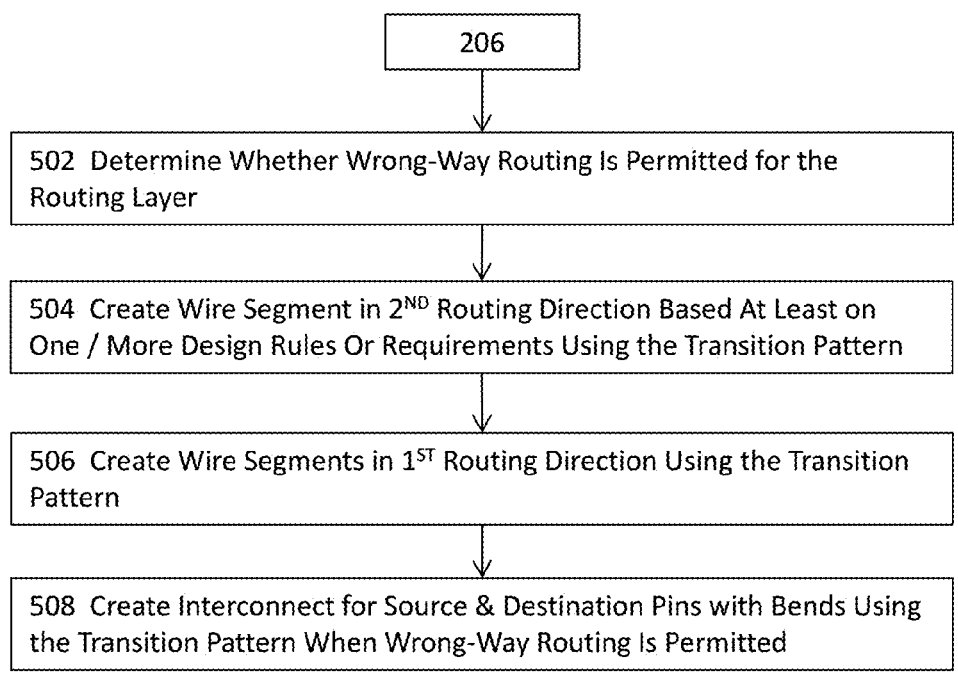
FIG. 5 illustrates a more detailed flow diagram for a process or module for implementing repetitive track patterns for electronic circuit designs illustrated in FIG. 2 in some embodiments.

FIG. 5 illustrates a more detailed flow diagram for a process or module for implementing repetitive track patterns for electronic circuit designs illustrated in FIG. 2 in some embodiments. More specifically, FIG. 5 illustrates more details about the process or module 206 for interconnecting the source pin and the destination pin of FIG. 2. The process or module 206 may determine whether wrong-way routing is permitted for the routing layer on which the first pin and the second pin reside at 502. Wrong-way routing permits routing an interconnect or wire with one or more bends on the same routing layer. In some embodiments where wrong-way routing is prohibited for the routing layer, no bends may be created for any interconnects or wires. Rather, the interconnect or wire segment in the wrong-way routing direction need to be implemented on an adjacent routing layer by using vias to transition back and forth between the current routing layer and the adjacent routing layer.

At 504, the process or module 206 may create a wire segment along the third track in the second routing direction by using the transition pattern based at least in part upon one or more design rules. The wire segment and its underlying track (e.g., the third track identified or determined at 404) in the second routing direction needs to satisfy various design rules governing tracks, track patterns, and implementation of the electronic design. If the underlying track fails to meet these pertinent design rules, the method or system may insert one or more intermediate tracks to render the resulting track pattern including the underlying track legal or may select another track for the third track at 404. In other words, if the identification or determination of the third track for the wire segment has been done at 404, the third track satisfies the pertinent design rules, and the process or module 206 may proceed with creating the wire segment along the third track at 504. At 506, the process or module 206 may further create one or more wire segments in the first routing direction based least in part upon the transition pattern identified at 204. Once the wire segments in both the first routing direction and the second routing direction are created, the process or module 206 may interconnect the source pin and the destination pin with one or more bends at 508 when wrong-way routing is permitted on the routing layer including the source and destination pins.

Figure 6:
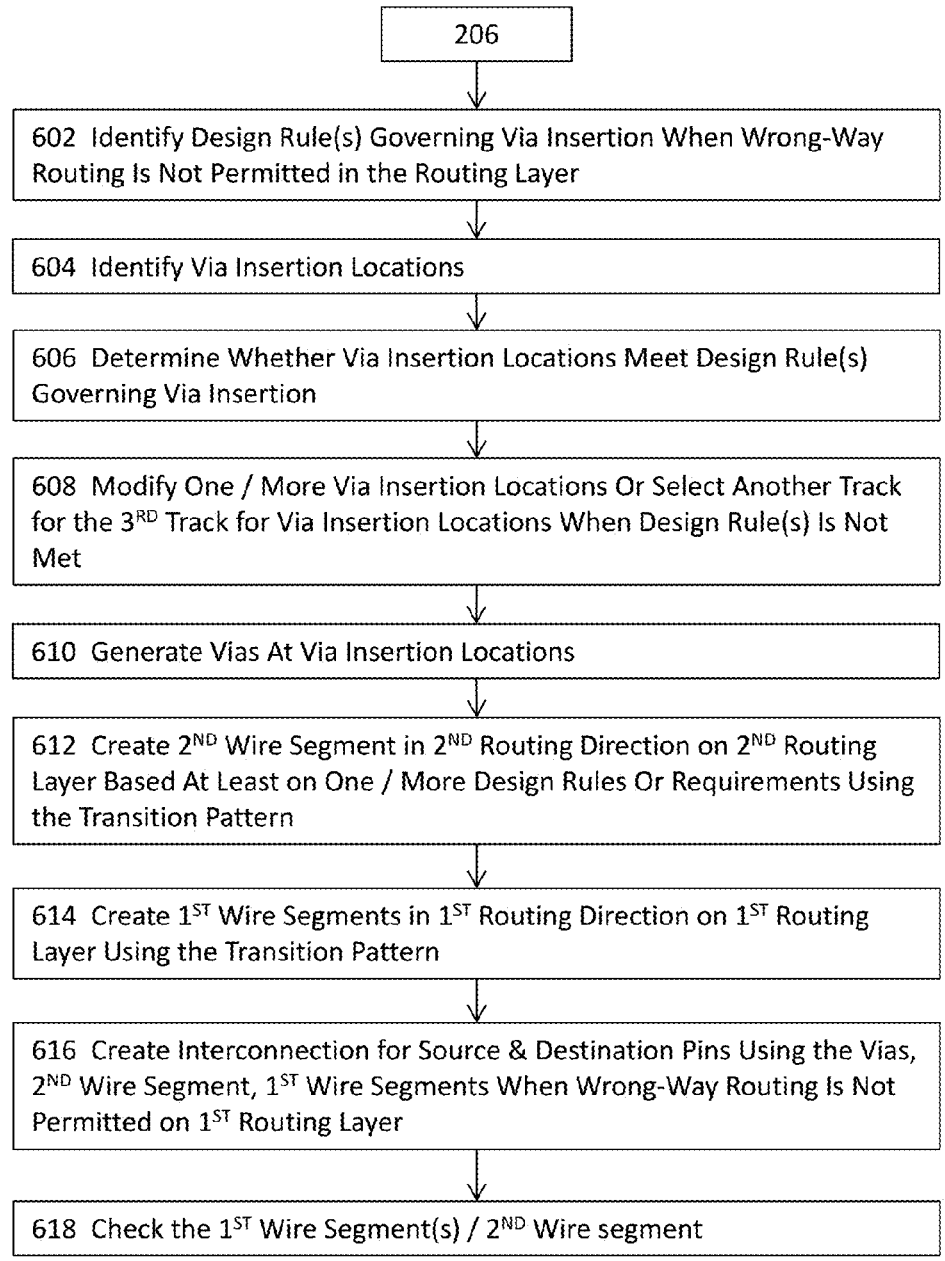
FIG. 6 illustrates a more detailed flow diagram for a process or module for implementing repetitive track patterns for electronic circuit designs illustrated in FIG. 2 in some embodiments.

FIG. 6 illustrates a more detailed flow diagram for a process or module for implementing repetitive track patterns for electronic circuit designs illustrated in FIG. 2 in some embodiments. More specifically, FIG. 5 illustrates more details about the process or module 206 for interconnecting the source pin and the destination pin of FIG. 2. Moreover, wrong-way routing is prohibited in these embodiments illustrated in FIG. 6. The method or system may identify a set of design rules governing via insertion at 602. The set of design rules may include via enclosure rule, via cut-size rule, or any other design rules governing the size or implementation of vias. At 604, the process or module 206 may identify one or more via insertion locations. For example, the process or module may identify the intersections of the first track and the third track, the second track and the third track, or the dummy track and the third track as a via insertion location at 604.

At 606, the process or module 206 may also determine whether the one or more via insertion locations meeting the set of design rules identified at 602. If the process or module 206 determines that a via insertion location fails to meet the set of design rules, the process or module 206 may modify the via insertion location or may select another track to replace the third track to determine a new or modified via insertion location, which when implemented with a via, meets the set of design rules identified at 602. The process or module 206 may generate one or vias at these one or more via insertion locations at 610 and create a second wire segment in the second routing direction on a second routing layer using the transition pattern based at least in part upon one or more design rules governing tracks, track patterns, or the implementation of the electronic design at 612.

The second wire segment is to be implemented on the second routing layer that is adjacent to the first routing layer on which the source pin and the destination pin reside. At 614, the process or module 206 may create the first wire segment in the first routing direction on the first routing layer on which the source pin and the destination pin reside. It shall be noted that the term "second routing direction" does not explicitly or implicitly indicate that there is more than one permissible routing direction on the second routing layer. Rather the term "second routing direction" is used to distinguish from the "first routing direction" for the first routing layer. At 616, the process or module 206 may interconnect the source pin and the destination pin by using at least the one or more vias, the second wire segment, and the one or more first wire segments.

At 618, the process or module may further check the one or more first wire segments and/or the second wire segment against one or more design rules for compliance. For example, the process or module 206 may check the first or the second wire segment against the minimum length design rule to determine whether one or more of these wire segments fail to meet the minimum length requirement. If the process or module 206 determines that a first wire segment connecting a pin (e.g., a source pin or a destination pin) fails to meet the minimum length design rule, the process or module may move the block boundary to regain the minimum length for the first wire segment in some embodiments.

In addition or in the alternative, a violation of the minimum length rule by the first wire segment may be corrected by metal fill connecting to the first wire segment. If the process or module 206 determines that the second wire segment fails to meet the minimum length design rule, the process or module may extend the second wire segment to increase the length of the second wire segment so as to meet the minimum length design rule. The process or module may also consider compaction in extending the second wire segment. For example, extending the second wire segment beyond a certain length may cause the second wire segment to violate the line-end spacing rule during compaction when the extended second wire segment is to be placed along the same track with one or more other wire segments. Therefore, the process or module may adjust the extension of the second wire segment based at least in part upon the line-end spacing rule.

Figure 7:
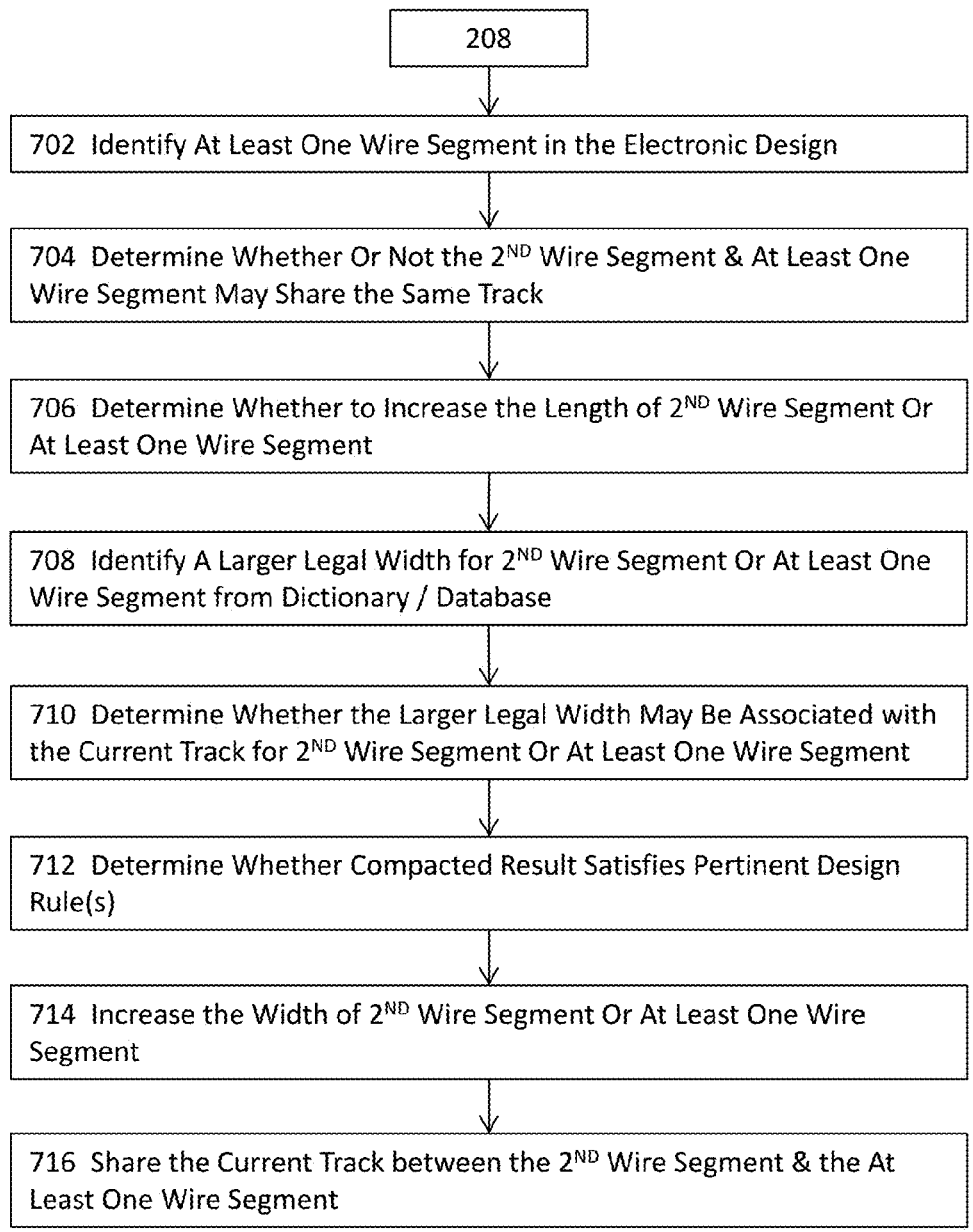
FIG. 7 illustrates a more detailed flow diagram for a process or module for implementing repetitive track patterns for electronic circuit designs illustrated in FIG. 2 in some embodiments.

FIG. 7 illustrates a more detailed flow diagram for a process or module for implementing repetitive track patterns for electronic circuit designs illustrated in FIG. 2 in some embodiments. More specifically, FIG. 5 illustrates more details about the process or module 206 for compacting at least some wire segments of FIG. 2. The process or module 208 may identify at least one wire segment in the electronic design at 702. The process or module 208 may then determine whether or not a second wire segment (e.g., the second wire segment created at 612) and the at least one wire segment may share the same track at 704. The process or module may make the determination at 704 based at least in part upon one or more criteria.

The one or more criteria may include, for example, the respective widths of the wire segments to be compacted, the tracks on which one or more of the wire segments are situated, the nets or types of nets of one or more of these wire segments, the modified lengths of one or more wire segments by the compaction process, etc. The process or module may further determine whether to modify the length of the second wire segment or the at least one wire segment at 706. In some embodiments, either or both wire segments may be modified to become longer or shorter in order to satisfy the pertinent design rules such as the same-track line-end spacing rule.

For example, the spacing between these two wire segments may need to be increased by increasing the length of one or both wire segments to meet the same-track line-end spacing rule. As another example, one or both wire segments may need to be adjusted, if allowed by pertinent design rules, to meet the keep-out rule. The process or module 208 may also adjust the length of a wire segment at 706 in order to align the line ends of multiple wire segments to simplify the photomask designs. At 708, the process or module may identify a larger legal or permissible width for the second wire segment or for the at least one wire segment. In some embodiments, the process or module 208 may identify the larger of the widths of the second wire segment and the at least one wire segment as the larger legal or permissible width for both wire segments and move the wire segment originally having a smaller width to the track on which the originally larger wire segment resides.

In some other embodiments, the process or module 208 may identify another track associated with a width that is larger than or equal to the larger width of these two wire segments and move both the at least one wire segment and the second wire segment to this track. At 710, the process or module 208 may determine whether the larger legal width may be associated with the current track for the second wire segment or for the at least one wire segment. In some embodiments where the process or module 208 identifies the larger width from the two wire segments, the determination at 710 may be trivial because the underlying track for the larger of these two wire segments is already associated with the larger legal width.

At 712, the process or module 208 may determine whether compacting the second wire segment and the at least one wire segment satisfies the pertinent design rules. For example, the process or module 208 may determine whether having these two tracks share the same track satisfies the keep-out rule with one or more immediately neighboring wire segments at 712. If the process or module finds that the compaction will result in a design rule violation, the process or module may initiate necessary fix to adjust either or both wire segments in order to comply with the pertinent design rules. The process or module 208 may also check the compacted shapes or wire segments against the pertinent design rules governing track and track patterns. For example, compacted shapes or segments may be checked against the pair design rule, the triplet design rule, or the keep-out rule to ensure that the compaction does not produce additional design rule violations.

In some embodiments, a compacted routing pattern may be expanded to form a legal expanded routing pattern. On the other hand, if a legal expanded routing pattern cannot be created, no compacted routing pattern may be found either. This is illustrated in FIGS. 9B-C. FIG. 9B illustrates an expanded routing pattern where each of the segments 902B, 904B, 906B, and 908B is implemented along its respective track. Moreover, the segment 912B, although not compacted, needs to satisfy the pertinent design rules. For example, segment 912B may be extended or contracted to comply with the keep-out rule. FIG. 9C illustrates the operation of a compaction process that results in segments 902C and 904C sharing the same horizontal track and segment 906C and 908C sharing another horizontal track.

FIG. 9C further illustrates that not all wire segments may be compacted. For example, segments 910B and 912B are not compacted to share same tracks with other segments. This may be due to, for example, the impact on signal integrity, timing, etc. or the failure to meet one or more design rules (e.g., line-end spacing rule, keep-out rule, etc.) if these wires were to be compacted. FIG. 9C further illustrates that the compacted segments 906C and 908C as well as 902C and 904C must satisfy the pertinent design rules. For example, the spacing 950C between segments 906C and 908C as well as the spacing 952C between segments 902C and 904C need to satisfy the same-track line-end spacing rule.

The process or module may then increase the width of the second wire segment or the at least one wire segment at 714 and have the second wire segment or the at least one wire segment share the same track at 716. The process or module 208 may further process other wire segments to further compact the electronic design. Compacting electronic design may lead to a simplified photomask design by eliminating at least some individual wire segments scattered along various tracks and arranging these at least some individual wire segments along the same tracks. This will lead to simpler photomask designs. If the process or module further performs wire length adjustment to align the line ends of some wire segments, this line end alignment may further simplify the photomask design. For example, if the right end of segment 912C in FIG. 9C may be aligned with the right end of segment 906C, and the left end of 902C may be aligned with the left end of 908C, the space as indicated by the spacing 950C may be formed with a single, rectangular cut on a block or trim mask, rather than having an irregular cut or multiple, smaller cuts to for what is shown in FIG. 9C without wire segment length adjustments.

Figure 9A:
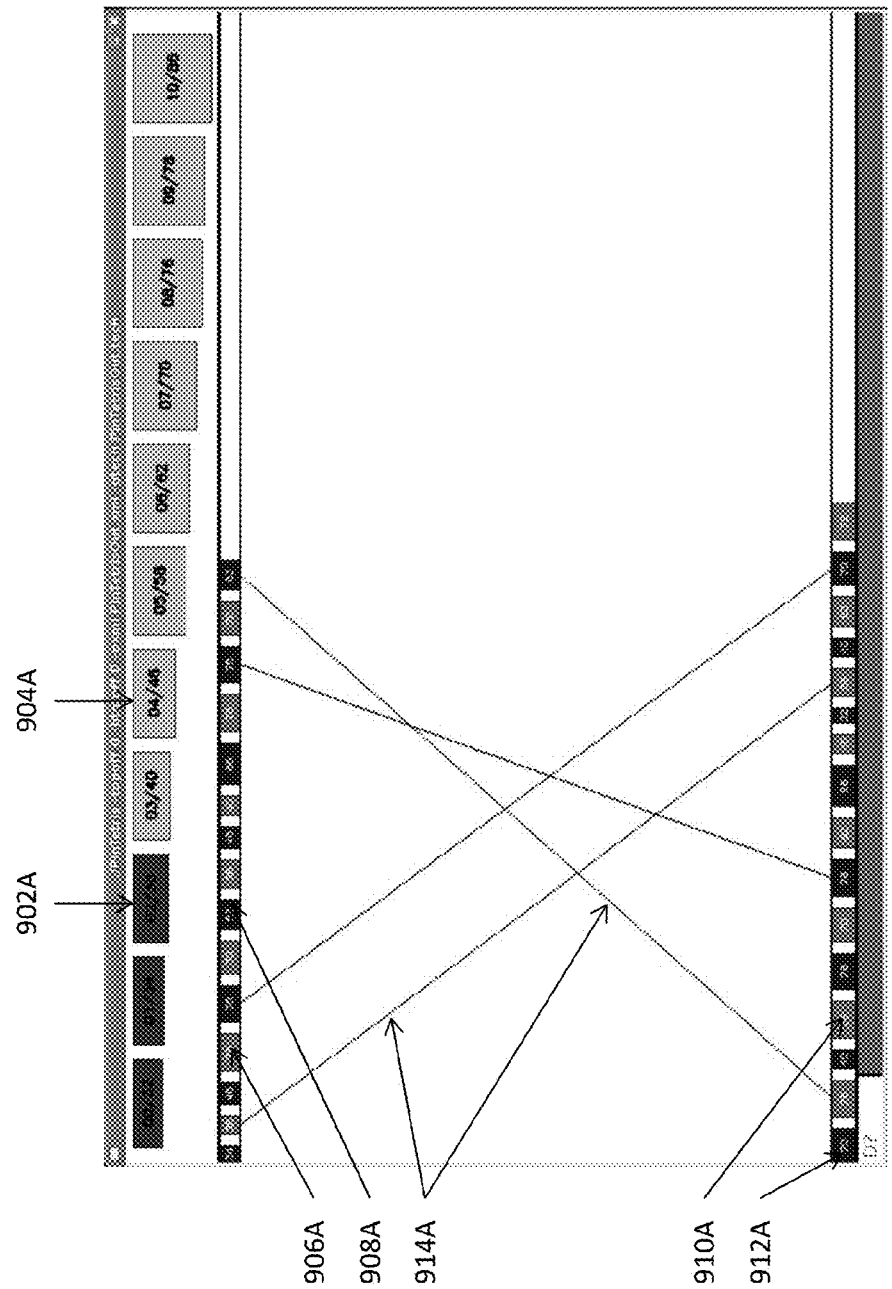
FIG. 9A illustrates a portion of an illustrative electronic design automation tool interface in some embodiments.
Figure 9B:
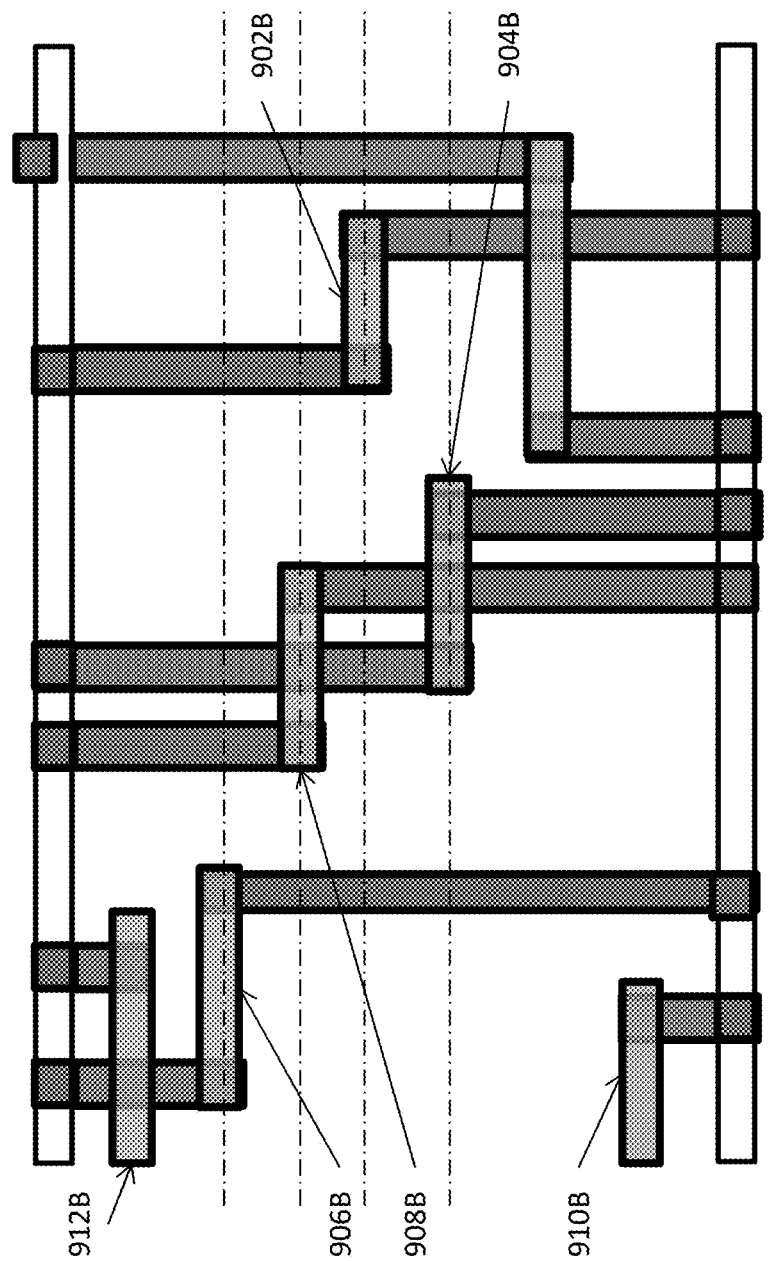
FIG. 9B-C show an illustrative portion of an electronic design with the compacted interconnection patterns in some embodiments.
Figure 9C:
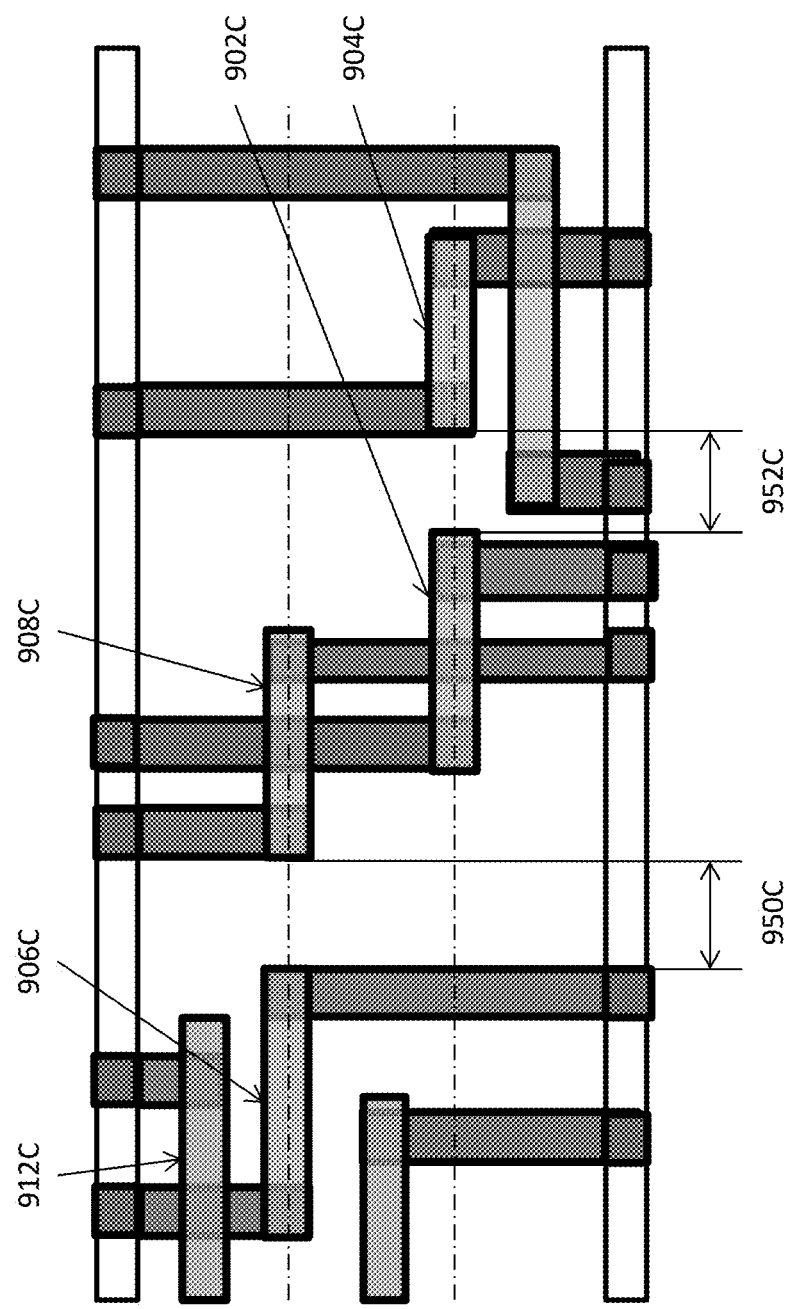

FIG. 9A illustrates a portion of an illustrative electronic design automation tool interface in some embodiments. More specifically, FIG. 9A illustrates a plurality of dominos, each indicating an identification and width to be associated with a selected track. The darker shaded dominos (e.g., 902A) indicate that these widths cannot be selected for the next track in a track patter due to, for example, violation of one or more design rules such as the pair design rule or the triplet design rule. The lighter shaded dominos (e.g., 904A) indicate that these widths may be selected for the next track in the track pattern. FIG. 9A also shows two rows of pins, each associated with its photomask designation and width. The width combinations of the pins in the top row are also governed by the design rules governing tracks and track patterns because these pins are a part of a first block design.

Similarly, the width combinations of the pins in the bottom row are also governed by the design rules governing tracks and track patterns because these pins are also a part of a second block design. For example, the top row may indicate a plurality of pins $\{PT_i\}$ where pin 906A is associated with the first photomask, and pin 908A is associated with the second photomask. Similarly, the bottom row may indicate a plurality of pins $\{PB_i\}$ where pin 910A is associated with the first photomask, and pin 912A is associated with the second photomask. FIG. 9A further illustrates some schematic interconnections $PT_i$ between top row pins $\{PT_i, PB_j\}$ and the bottom row pins $PB_j$. The blocks (e.g., the first block for the top row of pins and the second block for the bottom row of pins), the pins (e.g., $\{PT_i\}$, $\{PB_j\}$), the layer information of the current routing layer and the immediately neighboring layer(s), and the list of interconnections $\{PT_i, PB_j\}$ may be provided to various methods or systems as input. The method or the system may thus generate output including the transition pattern with horizontal and vertical segments, the dummy pins, via locations, etc.

Figure 10A:
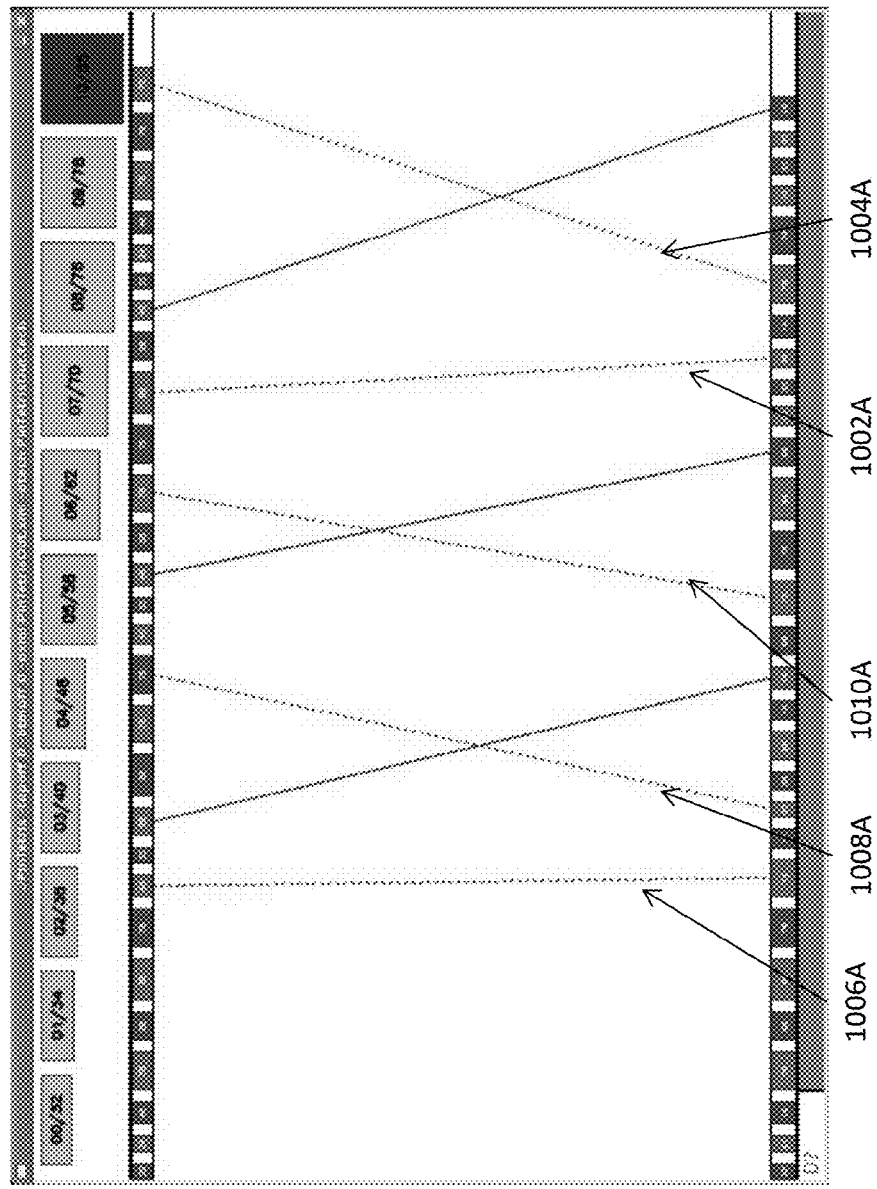
FIG. 10A shows an illustrative portion of an electronic design with a schematic representation of desired or required interconnections between two blocks in some embodiments.
Figure 10B:
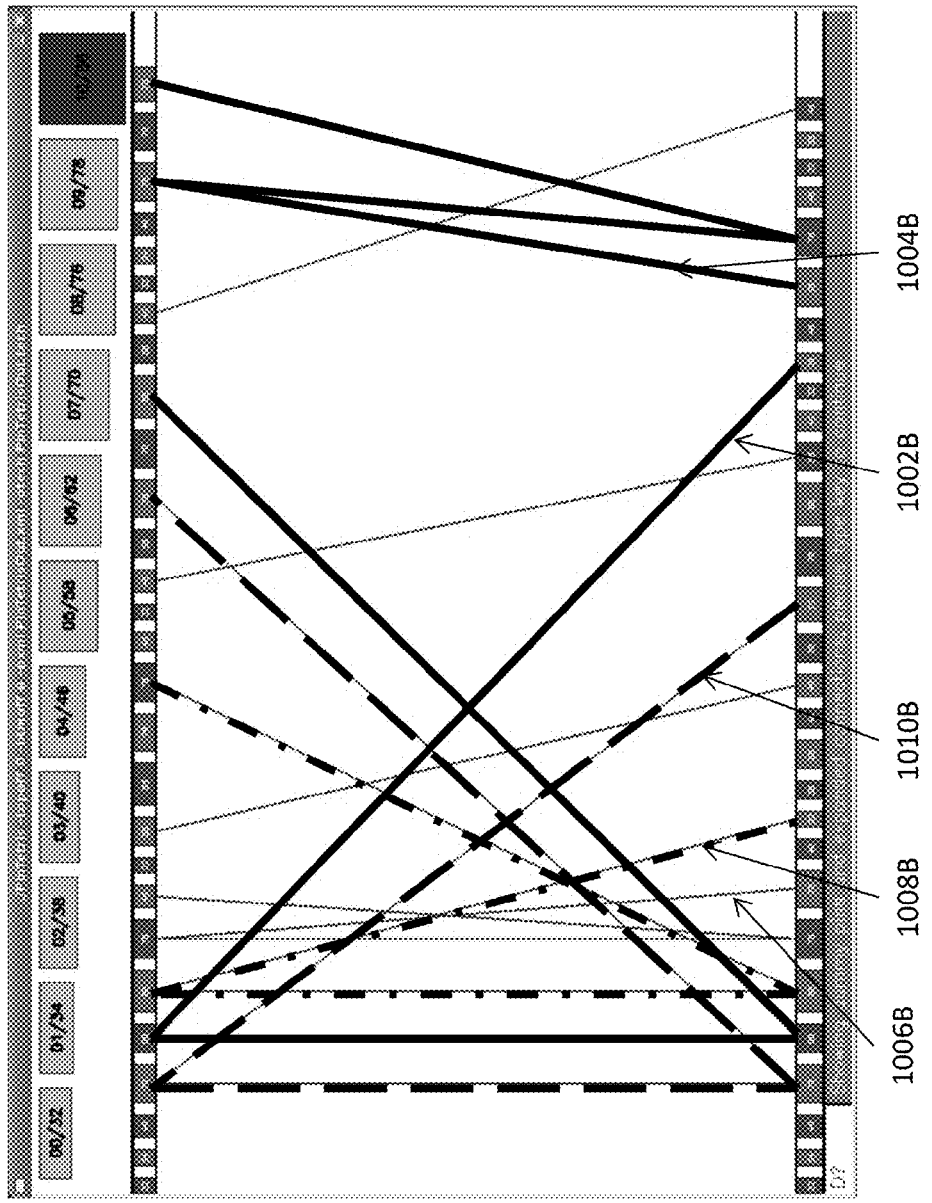
FIG. 10B shows an illustrative portion of an electronic design with a schematic representation of permuted interconnections between two blocks in some embodiments.
Figure 10C:
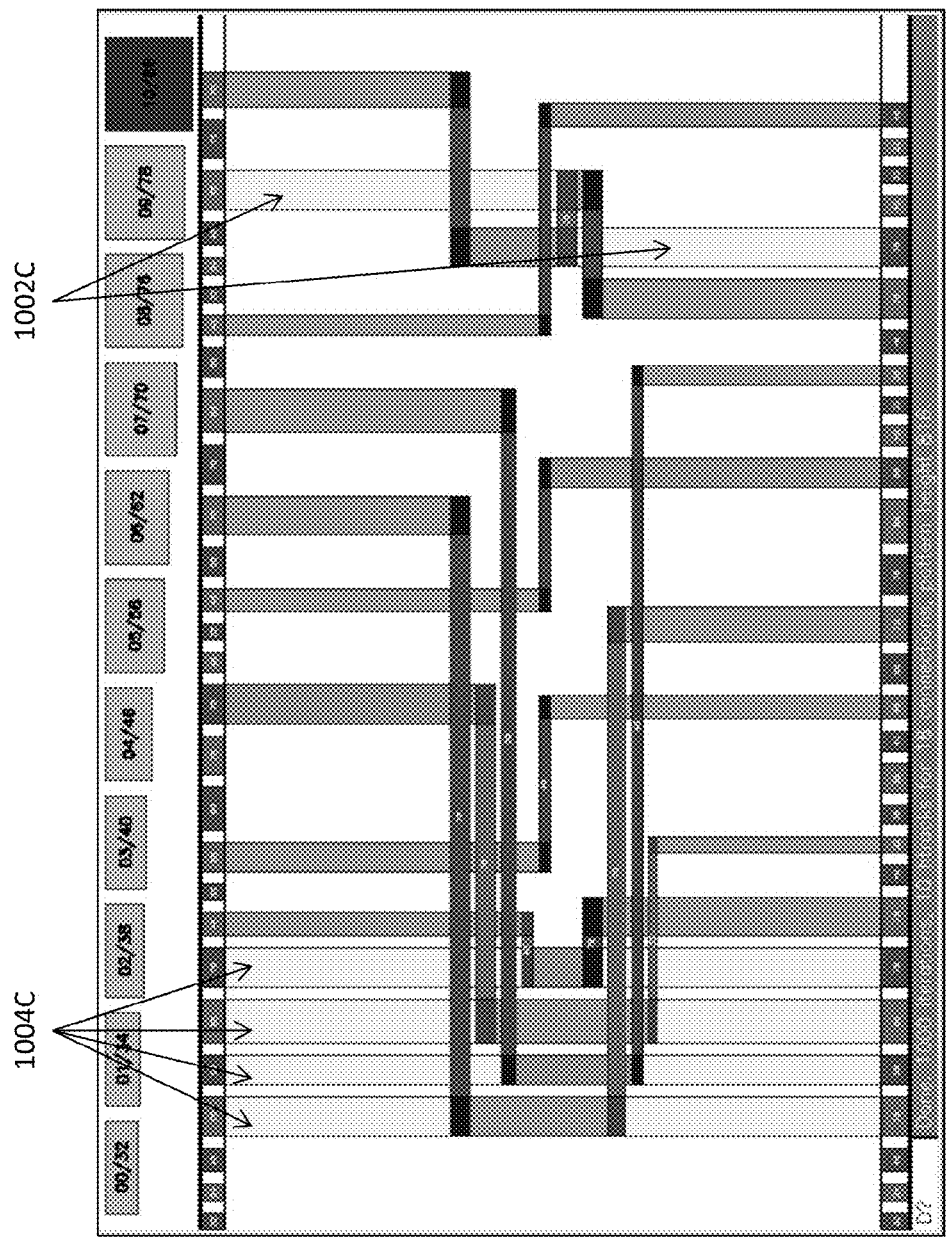
FIG. 10C shows an illustrative portion of an electronic design with implemented interconnections between two blocks with the use of dummy tracks in some embodiments.

FIG. 10A shows an illustrative portion of an electronic design with a schematic representation of desired or required interconnections between two blocks in some embodiments. More specifically, FIGS. 10A-C show that the automated process for generating physical interconnections in response to a designer's specification of connections between two blocks. A designer may specify the required or desired connections between pins $\{PT_i, PB_j\}$, where $\{PT_i, PB_j\}$ indicates the top row of pins and $\{PT_i, PB_j\}$ indicates the bottom row of pins. The designer may specify the connections by using the electronic design automation tool. For example, a designer may specify the connections graphically by selecting or clicking on the corresponding source and destination pins in a user interface or textually by entering the corresponding source and destination pins. Among these interconnections, the method or system described in the application may automatically use dummy pins or permuted interconnections to re-route the interconnections 1002A, 1004A, 1006A, 1008A, and 1010A.

For example, the top row pin and the bottom row pin for interconnection 1002A overlap with each other and thus cause downward dependency. The method or system may thus use a dummy pin to implement this interconnection. The schematic representation of this interconnection with the use of dummy pin is shown as 1002B in FIG. 10B. Similarly, interconnection 1004A may be similarly implemented as the schematic interconnection shown as 1004B in FIG. 10B. 1006A, 1008A, and 1010A may also be similarly implemented as 1006B, 1008B, and 1010B of FIG. 10B. FIG. 10C shows an illustrative implementation in the physical domain with the use of dummy pins along dummy tracks 1002C and 1004C by using the techniques described above.

System Architecture Overview

Figure 11:
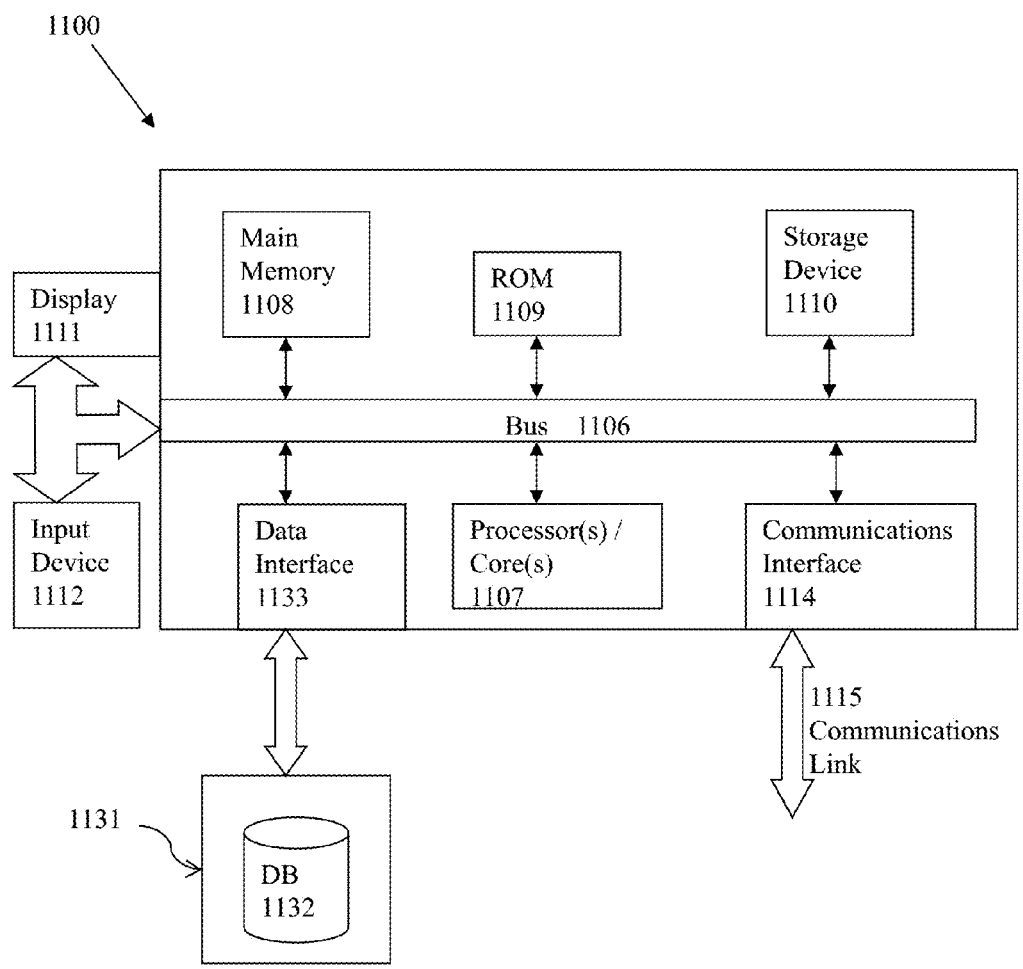
FIG. 11 illustrates a computerized system on which a method for implementing track patterns for electronic circuit designs can be implemented.

FIG. 11 illustrates a block diagram of an illustrative computing system 1100 suitable for interconnecting circuit components with track patterns for electronic circuit designs as described in the preceding paragraphs with reference to various figures. Computer system 1100 includes a bus 1106 or other communication mechanism for communicating information, which interconnects subsystems and devices, such as processor 1107, system memory 1108 (e.g., RAM), static storage device 1109 (e.g., ROM), disk drive 1110 (e.g., magnetic or optical), communication interface 1114 (e.g., modem or Ethernet card), display 1111 (e.g., CRT or LCD), input device 1112 (e.g., keyboard), and cursor control (not shown).

According to one embodiment, computer system 1100 performs specific operations by one or more processor or processor cores 1107 executing one or more sequences of one or more instructions contained in system memory 1108. Such instructions may be read into system memory 1108 from another computer readable/usable storage medium, such as static storage device 1109 or disk drive 1110. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 1107, where the one or more processors, one or more processor cores, or combination thereof executes one or more threads. For example, the act of identifying an electronic design, identifying or determining a transition pattern for interconnections, interconnection circuit components, compacting interconnections, etc. may be performed by one or more processors, one or more processor cores, or combination thereof. In one embodiment, the parasitic extraction, current solving, current density computation and current or current density verification is done in memory as layout objects or nets are created or modified.

The term "computer readable storage medium" or "computer usable storage medium" as used herein refers to any medium that participates in providing instructions to processor 1107 for execution. Such a medium may take many forms, including but not limited to, non-volatile media and volatile media. Non-volatile media includes, for example, optical or magnetic disks, such as disk drive 1110. Volatile media includes dynamic memory, such as system memory 1108. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1100. According to other embodiments of the invention, two or more computer systems 1100 coupled by communication link 1115 (e.g., LAN, PTSN, or wireless network) may perform the sequence of instructions required to practice the invention in coordination with one another.

Computer system 1100 may transmit and receive messages, data, and instructions, including program, i.e., application code, through communication link 1115 and communication interface 1114. Received program code may be executed by processor 1107 as it is received, and/or stored in disk drive 1110, or other non-volatile storage for later execution. In an embodiment, the computer system 1100 operates in conjunction with a data storage system 1131, e.g., a data storage system 1131 that includes a database 1132 that is readily accessible by the computer system 1100. The computer system 1100 communicates with the data storage system 1131 through a data interface 1133. A data interface 1133, which is coupled to the bus 1106, transmits and receives electrical, electromagnetic or optical signals that include data streams representing various types of signal information, e.g., instructions, messages and data. In embodiments of the invention, the functions of the data interface 1133 may be performed by the communication interface 1114.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for interconnecting circuit components with track patterns for electronic designs, comprising:
   identifying an electronic design including a source pin and a destination pin;
   identifying or determining a transition pattern for interconnecting the source pin and destination pin at least by selecting multiple routing tracks from one or more track patterns, wherein
      the one or more track patterns respectively correspond to one or more legal combinations of widths that are arranged in one or more predetermined permissible sequences and are associated with the multiple routing tracks, and a routing track in the multiple routing tracks has zero-width; and
   interconnecting, at one or more track pattern modules stored at least partially in memory and including or functioning in conjunction with at least one processor in a computing system, the source pin and the destination pin based at least in part upon the transition pattern.

2. The computer implemented method of claim 1, the act of identifying the electronic design comprising:
   identifying the source pin on a first routing track and the destination pin on a second routing track;
   identifying a set of design rules governing implementation of the electronic design; and
   identifying or determining an ordering of interconnections.

3. The computer implemented method of claim 2, the act of identifying the electronic design further comprising:
   identifying or determining a dependency relation between the source pin and the destination pin; and
   identifying one or more characteristics associated with the first routing track and the second routing track, wherein
      the one or more characteristics include a first width of the source pin and a second width of the destination pin, and
      the one or more characteristics are used to determine a width of a transition segment for interconnecting the source pin and the destination pin with the transition pattern.

4. The computer implemented method of claim 1, the act of identifying or determining the transition pattern comprising:
   identifying the source pin along a first routing track and the destination along a second routing track in a first routing direction;
   identifying or determining one or more characteristics of the transition pattern, wherein the one or more characteristics include a first width associated with the first routing track or the second width associated with the routing second track;
   identifying a third routing track in a second routing direction for the transition pattern; and identifying a dummy routing track for the first routing track or the second routing track.

5. The computer implemented method of claim 4, the act of identifying or determining the transition pattern further comprising:
identifying one or more neighboring routing tracks of the dummy routing track;
determining whether or not the dummy routing track, when inserted or arranged at a location, satisfies design rules governing routing tracks and track patterns; and
inserting the dummy routing track at the location when the dummy routing track is determined to satisfy the design rules.

6. The computer implemented method of claim 5, the act of identifying or determining the transition pattern further comprising:
identifying or creating a dummy pin along the dummy routing track; and
generating the transition pattern using at least the dummy pin, the dummy routing track, and the third routing track.

7. The computer implemented method of claim 1, the act of interconnecting the source pin and the destination pin comprising:
identifying the source pin along a first routing track and the destination pin along a second routing track in a first routing direction;
creating a wire segment along a third routing track in a second routing direction based at least in part upon the transition pattern and a set of design rules;
creating one or more wire segments in the first routing direction based at least in part upon the transition pattern and the set of design rules; and
creating an interconnection between the source pin and the destination pin with one or more bends by using the wire segment in the second routing direction and the one or more wire segments in the first routing direction.

8. The computer implemented method of claim 1, the act of interconnecting the source pin and the destination pin comprising:
identifying the source pin along a first routing track, the destination pin along a second routing track in a first routing direction on a first routing layer, and a third routing track along a second routing direction on a second routing layer;
identifying one or more via insertion locations and one or more via design rules governing implementation of vias in the electronic design;
ensuring the one or more via insertion locations satisfy the one or more via design rules; and
creating one or more vias at the one or more via insertion location based at least in part upon a result of ensuring the one or more via insertion locations satisfy the one or more via design rules.

9. The computer implemented method of claim 8, the act of interconnecting the source pin and the destination pin comprising:
creating one or more first wire segments in the first routing direction on the first routing layer based at least in part upon the transition pattern and the one or more via insertion locations;
creating a second wire segment in the second routing direction on the second routing layer based at least in part upon the transition pattern and the one or more via insertion locations; and
determining whether the one or more first wire segments or the second wire segment is design rule check clean.

10. The computer implemented method of claim 1, the process further comprising:
compacting the electronic design by modifying at least one location of a shape to another location.

11. The computer implemented method of claim 10, the process further comprising:
identifying a first shape along a first routing track associated with a first width and a second shape along a second routing track associated with a second width in a layout of the electronic design, wherein the first width is larger than the second width;
determining whether placing the first shape and the second shape on a same routing track satisfies a first set of design rules;
moving the second shape on the second routing track to the first routing track; and
reconfiguring the electronic design based at least in part upon a result of moving the second shape.

12. The computer implemented method of claim 11, the process further comprising:
determining whether a first length of the first shape or a second length of the second shape is modifiable; and
determining whether the electronic design including the second shape that has been moved to the first routing track satisfies a second set of design rules.

13. A system for interconnecting circuit components with track patterns for electronic designs, comprising:
a computer system including at least one processor or processor core that executes a sequence of instructions to:
identify an electronic design including a source pin and a destination pin;
identify or determine a transition pattern for interconnecting the source pin and destination pin at least by selecting multiple routing tracks from one or more track patterns, wherein
the one or more track patterns respectively correspond to one or more legal combinations of widths that are arranged in one or more corresponding permissible orders and are associated with the multiple routing tracks, and a routing track in the multiple routing tracks has zero-width; and
one or more track pattern modules stored at least partially in memory and including or functioning in conjunction with at least one processor or processor core to interconnect the source pin and the destination pin based at least in part upon the transition pattern.

14. The system of claim 13, wherein the at least one processor or processor core that executes a sequence of instructions to identify the electronic design further executes:
a first sequence of instructions to:
identify the source pin on a first routing track and the destination pin on a second routing track;
identify or determine an ordering of interconnections; and
identify or determine a dependency relation between the source pin and the destination pin; or
a second sequence of instructions to:
identify the source pin along the first routing track and the destination along the second routing track in a first routing direction; and
identify a third routing track in a second routing direction for the transition pattern and a dummy routing track for the first routing track or the second routing track.

15. The system of claim 14, wherein the at least one processor or processor core that executes a sequence of instructions to identify or determining the transition pattern further executes the sequence of instructions to:
- determine whether or not the dummy routing track, when inserted or arranged at a location, satisfies design rules governing routing tracks and track patterns based at least in part upon one or more neighboring routing tracks of the dummy routing track;
- insert the dummy routing track at the location when the dummy routing track is determined to satisfy the design rules;
- identify or create a dummy pin along the dummy routing track; and
- generate the transition pattern using at least the dummy pin, the dummy routing track, and the third routing track.

16. The system of claim 13, wherein the at least one processor or processor core that executes a sequence of instructions to interconnect the source pin and the destination pin further executes the sequence of instructions to:
- a first sequence of instructions to:
  - identify the source pin along a first track and the destination pin along a second routing track in a first routing direction;
  - create a wire segment along a third routing track in a second routing direction based at least in part upon the transition pattern and a set of design rules;
  - create one or more wire segments in the first routing direction based at least in part upon the transition pattern and the set of design rules; and
  - create an interconnection between the source pin and the destination pin with one or more bends by using the wire segment in the second routing direction and the one or more wire segments in the first routing direction;
- a second sequence of instructions to:
  - identify the source pin along the first routing track, the destination pin along the second routing track in a first routing direction on a first routing layer, and the third routing track along a second routing direction on a second routing layer;
  - identify one or more via insertion locations and one or more via design rules governing implementation of vias in the electronic design; and
  - create one or more vias at the one or more via insertion location based at least in part upon a result of ensuring the one or more via insertion locations satisfy the one or more via design rules; or
- a third sequence of instructions to:
  - compact the electronic design, comprising;
  - identify a first shape along the first routing track associated with the first width and a second shape along the second track associated with a second width in a layout of the electronic design, wherein the first width is larger than the second width;
  - determine whether placing the first shape and the second shape on a same routing track satisfies a first set of design rules;
  - move the second shape on the second routing track to the first routing track; and
  - reconfigure the electronic design based at least in part upon a result of moving the second shape.

17. An article of manufacture comprising a non-transitory computer accessible storage medium having stored thereupon a sequence of instructions which, when executed by at least one customizable processor executing one or more threads, causes the at least one customizable processor to perform a method for interconnecting circuit components with track patterns for electronic designs, the method comprising:
- identifying an electronic design including a source pin and a destination pin;
- identifying or determining a transition pattern for interconnecting the source pin and destination pin at least by selecting multiple routing tracks from one or more track patterns, wherein
- the one or more track patterns respectively correspond to one or more legal combinations of widths arranged in one or more corresponding permissible orders that are arranged in one or more predetermined permissible sequences and are associated with the multiple routing tracks, and a routing track in the multiple routing tracks has zero-width; and
- interconnecting, at one or more track pattern modules stored at least partially in memory and including or functioning in conjunction with at least one processor in the computing system, the source pin and the destination pin based at least in part upon the transition pattern.

18. The article of manufacture of claim 17, the act of identifying the electronic design comprising:
- a first set of actions including:
  - identifying the source pin on a first routing track and the destination pin on a second routing track;
  - identifying or determining an ordering of interconnections; and
  - identifying or determining a dependency relation between the source pin and the destination pin; or
- a second set of actions including:
  - identifying the source pin along the first routing track and the destination along the second routing track in a first routing direction; and
  - identifying a third routing track in a second routing direction for the transition pattern and a dummy routing track for the first routing track or the second routing track.

19. The article of manufacture of claim 18, the act of identifying or determining the transition pattern further comprising:
- determining whether or not the dummy routing track, when inserted or arranged at a location, satisfies design rules governing routing tracks and track patterns based at least in part upon one or more neighboring routing tracks of the dummy routing track;
- inserting the dummy routing track at the location when the dummy routing track is determined to satisfy the design rules;
- identifying or creating a dummy pin along the dummy routing track; and
- generating the transition pattern using at least the dummy pin, the dummy routing track, and the third routing track.

20. The article of manufacture of claim 17, the act of interconnecting the source pin and the destination pin comprising:
- a first set of actions including:
  - identifying the source pin along a first routing track and the destination pin along a second routing track in a first routing direction;
  - creating a wire segment along a third routing track in a second routing direction based at least in part upon the transition pattern and a set of design rules;
  - creating one or more wire segments in the first routing direction based at least in part upon the transition pattern and the set of design rules; and creating an interconnection between the source pin and the destination pin with one or more bends by using the wire segment in the second routing direction and the one or more wire segments in the first routing direction;
a second set of actions including:
  identifying the source pin along the first routing track, the destination pin along the second routing track in a first routing direction on a first routing layer, and a third routing track along a second routing direction on a second routing layer;
  identifying one or more via insertion locations and one or more via design rules governing implementation of vias in the electronic design; and
  creating one or more vias at the one or more via insertion location based at least in part upon a result of ensuring the one or more via insertion locations satisfy the one or more via design rules; or
a third set of actions including:
  compacting the electronic design, comprising;
  identifying a first shape along the first routing track associated with a first width and a second shape along the second routing track associated with a second width in a layout of the electronic design, wherein the first width is larger than the second width;
  determining whether placing the first shape and the second shape on a same routing track satisfies a first set of design rules;
  moving the second shape on the second routing track to the first routing track; and
  reconfiguring the electronic design based at least in part upon a result of moving the second shape.

* * * * *